United States Patent [19]

Peterson et al.

[11] Patent Number: 4,523,883
[45] Date of Patent: Jun. 18, 1985

[54] PRINTED CIRCUIT BOARD FASTENER

[75] Inventors: Francis C. Peterson, St. Charles; William G. Rodseth, Elgin; William A. Spring, Geneva, all of Ill.

[73] Assignee: Illinois Tool Works Inc., Chicago, Ill.

[21] Appl. No.: 434,816

[22] Filed: Oct. 18, 1982

[51] Int. Cl.³ .......................... F16B 37/06; H01B 7/34
[52] U.S. Cl. .................................. 411/171; 411/186; 411/437; 411/82; 174/52 H
[58] Field of Search ....................... 411/8–11, 411/14, 171, 173–181, 186, 188, 290, 368–370, 376, 375, 373, 374, 429–431, 427, 436, 437, 544, 542, 546, 82; 174/16 HS, 52 H; 361/388, 389, 417

[56] References Cited

U.S. PATENT DOCUMENTS

| | | | |
|---|---|---|---|
| 1,229,911 | 6/1917 | Dodds | 411/186 |
| 1,931,649 | 10/1933 | Eger | 411/188 |
| 2,305,654 | 12/1942 | Wilkinson | 411/171 |
| 3,350,975 | 11/1967 | Bien | 411/437 |
| 3,415,943 | 12/1968 | Meyerhoff | 174/52 H |
| 3,457,824 | 7/1969 | Derby | 411/429 |
| 4,403,102 | 9/1983 | Jordan et al. | 411/171 |

Primary Examiner—Thomas J. Holko
Assistant Examiner—Neill Wilson
Attorney, Agent, or Firm—David I. Roche; Thomas W. Buckman

[57] ABSTRACT

The invention includes a method and a fastener for use in attaching articles to printed circuit boards. The fastener, which has a generally tubular body, flanged at one end, is adapted to receive a screw. The fastener has a polygonal cross-section over a portion of its length. The flange which is located at one end of the tubular body, has an integral spring washer and includes indentations which allow solder to flow from one side of the printed circuit board to the other. The fastener with its integral spring washer provides improved clamping characteristics and avoids problems associated with large coefficients of thermal expansion of printed circuit board material in a direction perpendicular to the board.

5 Claims, 4 Drawing Figures

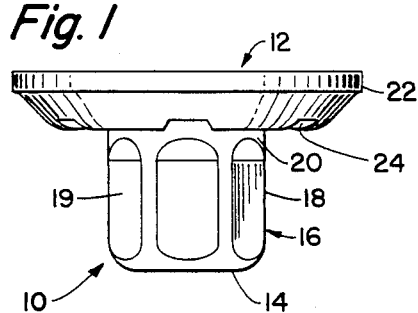
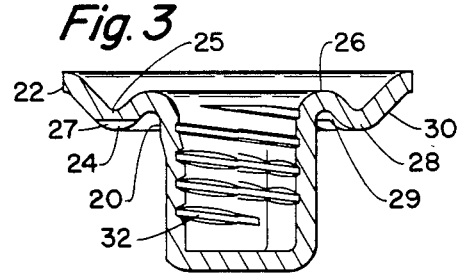
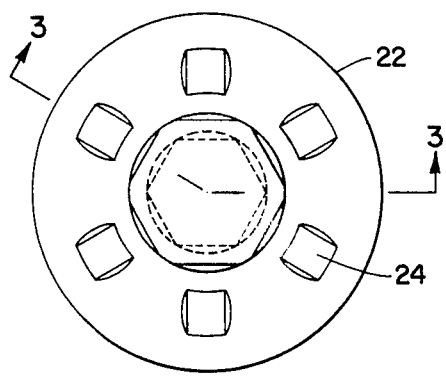
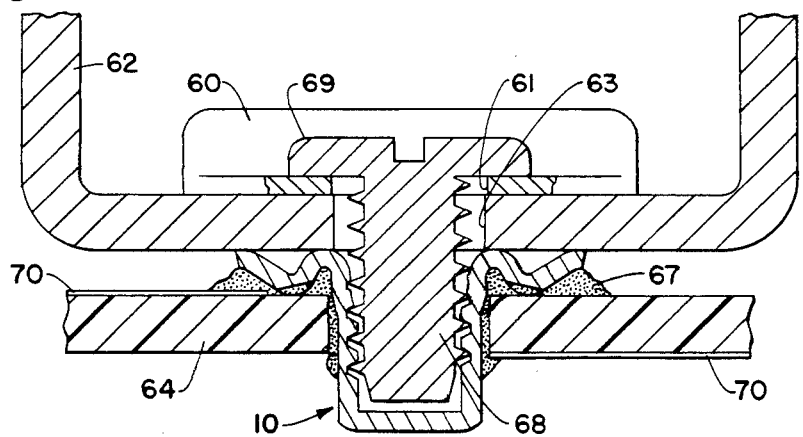

PRINTED CIRCUIT BOARD FASTENER

BACKGROUND OF THE INVENTION

This invention relates to the art of attaching articles to a printed circuit board. The invention is particularly applicable in the attachment of power transistors and their associated heat sinks to printed circuit boards made of fibrous material.

Generally printed circuit boards are made of fiber reinforced plastic. Large amounts of rather delicate and thermally sensitive circuitry are disposed on the surface of the boards. The use of fibrous material arranged generally parallel to the plane of the board tends to minimize the effects of thermal expansion and contraction upon inplane circuitry. However, the coefficient of thermal expansion in a direction perpendicular to the plane of the panel is increased significantly as a result. And, therefore, firmly attaching articles to printed circuit boards has been a problem. The problem is particularly acute in the case of power transistors and their associated heat sinks, because in order for the heat sink to dissipate sufficient amounts of heat, close and continuous contact must be maintained between the power transistor and the heat sink. The problem is compounded by the face that power transistors by design undergo frequent thermal cycling. This cycling causes expansion and contraction of neighboring materials. As a result both thermal and electrical conductivity may be impaired.

SUMMARY OF THE INVENTION

A primary object of the present invention is to provide a fastener which facilitates and improves the attachment of articles to printed circuit boards.

Another object of the present invention is to provide a fastener capable of maintaining thermal and electrical contact between articles in the environment of a printed circuit board.

Another object of the present invention is to provide a fastener which can be easily attached to a printed circuit board.

Another object of the invention is to provide a fastener which will prolong the life of a power transistor.

Another object of the invention is to provide a fastener whereby a power transistor can easily be replaced.

Yet another object of the invention is to provide a method of attaching a power transistor with its associated heat sink to a printed circuit board.

These and other objects of the invention can be achieved by using a fastener which has a generally tubular body, flanged at one end and which is adapted to receive a screw. The fastener has an open end and a closed end and polygonal cross-section over a portion of its length. The flange which is located at the open end of the tubular body, has an integral spring washer which flares in a direction away from the closed end. In a preferred embodiment the flange includes indentations which allow solder to flow from one side of the printed circuit board to the other. The fastener with its integral spring washer provides excellent clamping characteristics over a wide range of thermal conditions because the inclusion of fibrous material is avoided. And yet, mechanical and electrical connection between the fastener and the printed circuit board is enhanced by the various structural features of the fastener hereinafter described.

BRIEF DESCRIPTION OF THE DRAWINGS

FIG. 1 is a side elevational view of a fastener of the present invention.

FIG. 2 is an end view of the fastener of the present invention.

FIG. 3 is a sectional view taken along line 3—3 in FIG. 2.

FIG. 4 is a sectional view of the fastener shown in FIGS. 1-3 as it is used to attach a power transistor and heat sink to a printed circuit board.

DETAILED DESCRIPTION OF THE INVENTION

The fastener of the present invention is shown generally at 10 in FIGS. 1, 2 and 3. The fastener includes tubular body 16 with an open end 12 and a closed end 14. The fastener has a flange 22 at its open end. The tubular body 16 has a polygonal cross-section 18 which begins substantially at the closed end 14 and extends over a major portion of the length of the tubular body 16. The tubular body has a circular cross-section 20 over a minor portion of its length. The circular cross-section is near the open end of the fastener. The flange 22 includes indentations 24. Each indentation creates a zone 25 of reduced thickness as shown in FIG. 3. The flange 22 further includes a conical spring washer 30 and an inner flange portion 26. The tubular body has internal threads 32 and external faceted wrenching surfaces 19.

FIG. 3 shows the generally sinuate cross-sectional configuration of the flange 22. The inner flange portion 26 is an arcuate extension of the tubular body. The arcuate configuration of the inner flange section creates a recessed area or circumferential channel 29 for the inner flow of air and solder during cleaning and connecting operations. An arcuate abutting portion 28 is adjacent the inner flange portion and is a continuation thereof. The indentations 24 are intermittently disposed on the abutting portion 28 and provide tributaries or passageways 27 for the egress of fluids during cleaning and connecting. The conical spring washer 30 is an integral substantially radial extension of the abutting portion 28. The spring washer 30 extends and flairs in an axial direction away from the closed end of the tubular body substantially further than the inner flange portion 26 to allow for resilient deflection of the conical spring washer. The inner flange portion 26 therefore acts as a stop to limit the deflection of the conical spring washer 30.

FIG. 4 shows the fastener in the environment of a printed circuit board. The fastener 10 is used with a screw 68 to attach a power transistor 60 and a heat sink 62 to a printed circuit board 64. The screw 68 is inserted through a hole 61 in the transistor 60 and through a hole 63 in the heat sink 62. The screw is then inserted into the open end 12 of the fastener 10. As the screw is advanced into the internal threads 32, the conical spring washer 30 is deflected causing a clamping relationship between the head 69 of the screw 68 and the flange 22. The inner flange portion 26 prevents over stressing of the conical spring washer 30. The heat sink 62 and the transistor 60 are held in firm contact with one another to insure proper thermal conductivity whereby heat can be dissipated from the transistor 60 through the heat sink 62. Similarly the power transistor is in firm contact with the head 69 of the screw 68. This is significant because in many transistors one terminal is built into the case of the transistor making good electrical connection of the transistor 60 to the board via the screw 68 an important consideration. The flange 22 of the fastener therefore enhances the performance of the transistor by improving both thermal and electrical properties of the transistor, heat sink, and printed circuit board assembly.

FIG. 4 also shows how the fastener is attached to the printed circuit board. The tubular body 16 has wrenching flats 19 which in the preferred embodiment are in alignment with the indentations 24 to promote the flow of fluids from one side of the board to the other. Prior to soldering forced air can be used to remove contaminants which have lodged around the fastener. Passageways 27 created by the indentations 24 allow free flow of air and solder thus making better electrical and mechanical connection possible.

With the fastener of the present invention electrical connection can be made to both sides of the printed circuit board by any of several soldering techniques, but is particularly facilitated in the case of wave soldering. The flow of solder to both sides of the printed circuit board is important because in many situations circuitry 70 is placed on both sides of the board 64.

By providing for the flow of solder to both sides of the board frictional contact between the solder and the board is also improved. The faceted surfaces 19 of the polygonal cross-section 18 of the tubular body prevents rotation of the fastener within hardened solder used to connect the fastener to the board because they interfere with the hardened solder. The anti-rotation feature is enhanced by the indentations 24 which also engage the hardened solder.

It is also contemplated, but not shown, that the portion of the spring washer 30 which contacts the heat sink could be provided with engagement means which would tend to prevent relative rotation between the fastener and the heat sink. This would tend to preserve the integrity of the soldered connection upon removal of the screw.

It should be noted that the indentations 24 provide a means for controlling the stiffness of the conical spring washer. By reducing the thickness of the flange 22 at the zone 25 the stiffness of the spring can be modified and the mode of deflection can be controlled.

The indentations 24 therefore have 3 distinct functions. First, they allow for the flow of air and solder from one side of the printed circuit board to the other around the fastener. Second, they provide a means for controlling the stiffness and location of flexure of the conical spring washer. Third, they assist in preventing rotation of the fastener because they promote engagement of the flange in the solder 67.

It should also be noted that the circular cross-section 20 at the open end of the tubular body 16 is adapted to facilitate the tapping operation whereby threads 32 are formed in the tubular body. Tapping is facilitated because the outer diameter of the circular cross-section is at least as large as the major outer diameter of the hexagonal cross-section 18. In the preferred embodiment the circular cross-section is tangent to the points which form the major diameter of the hexagonal cross-section. This promotes proper alignment of a tapping tool so that threads may be properly formed in the hexagonal portion of the fastener.

While the invention has been described in conjunction with specific embodiments thereof, it is evident that many alternatives, modifications and variations will be apparent to those skilled in the art. Accordingly the invention is intended to embrace all such alternatives, modifications and variations as fall within the spirit and scope of the appended claims.

We claim:

1. A fastener for use in assembling an article to a printed circuit board having an aperture, said fastener comprising: a generally tubular internally threaded nut body adapted to be inserted into said aperture, a radially extending flange integrally formed at one end of said body, said flange including an integral conical spring washer which flairs radially outwardly and in a direction away from said body, said flange also including an inner first portion immediately adjacent said body, said first portion providing stopping means to limit deflection of said conical spring washer, said first portion creating a circumferential recess for allowing flow of fluids about said body, a spacer disposed between said first portion and said conical spring washer, said spacer including radial flow channels communicating with said circumferential recess.

2. A fastener according to claim 1 wherein said tubular body has a portion which has a polygonal cross-section to provide means for applying torque to said fastener.

3. A fastener according to claim 2 wherein said tubular body has a circular cross-section at said one end, said circular cross-section having an outer diameter at least as large as a maximum diameter of said polygonal cross-section.

4. A fastener according to claim 1 wherein said tubular body has a closed end opposite said one end.

5. A fastener according to claim 1 wherein said tubular body is internally tapped, and externally solderable.

* * * * *